United States Patent [19]

Lalanne et al.

[11] Patent Number: 5,153,824
[45] Date of Patent: Oct. 6, 1992

[54] HIGH STABILITY CLOCK SYNCHRONIZED ON AN EXTERNAL SYNCHRONIZATION SIGNAL

[75] Inventors: Alain Lalanne, Colombes; André Lankar, Paris, both of France

[73] Assignee: Alcatel Cit, Paris, France

[21] Appl. No.: 598,511

[22] Filed: Oct. 16, 1990

[30] Foreign Application Priority Data

Oct. 17, 1989 [FR] France ................ 89 13551

[51] Int. Cl.$^5$ .................. G06F 15/20; H03K 5/13
[52] U.S. Cl. .................. 364/184; 307/269; 328/72; 364/569
[58] Field of Search ............... 364/184–187, 364/569, 571.01–571.08; 375/107, 108, , 120; 455/31, 69; 328/155, 63, 72–75, 133; 307/269; 331/11, 17

[56] References Cited

U.S. PATENT DOCUMENTS

| | | | |
|---|---|---|---|
| 4,630,291 | 12/1986 | Lankar et al. | 375/107 |
| 4,835,481 | 5/1989 | Geissler et al. | 328/155 |
| 4,882,739 | 11/1989 | Potash et al. | 364/569 X |
| 4,893,318 | 1/1990 | Potash et al. | 364/569 X |

*Primary Examiner*—Joseph Ruggiero
*Attorney, Agent, or Firm*—Sughrue, Mion, Zinn, Macpeak & Seas

[57] ABSTRACT

The synchronized clock receives a plurality of external synchronization signals and includes a servo-control signal generator in association with each of said external synchronization signals. The synchronized clock also includes a control unit which produces the control signal actually applied to a clock generator by selecting a particular one of the servo-control signals on the basis of quality criteria.

16 Claims, 1 Drawing Sheet

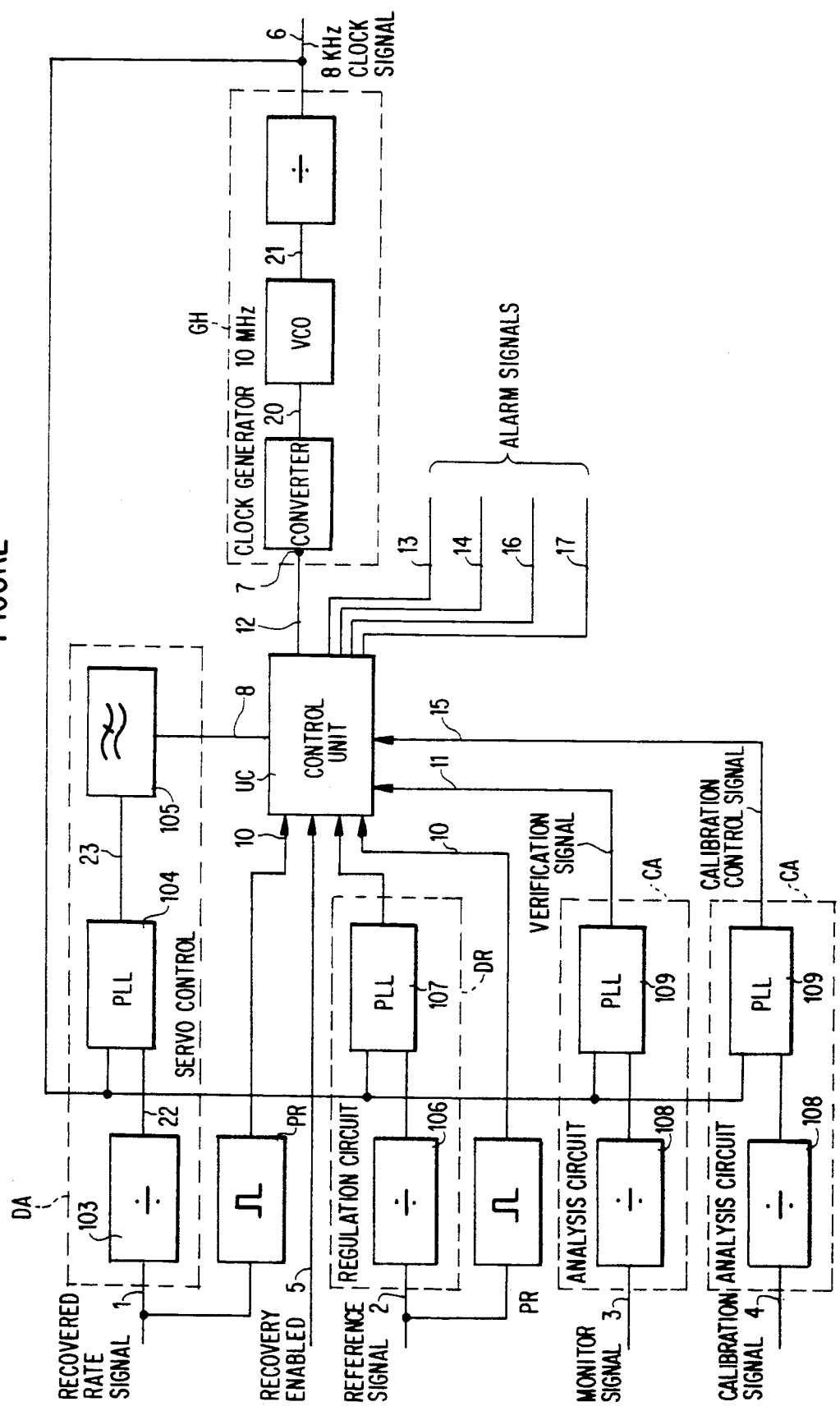
FIGURE

HIGH STABILITY CLOCK SYNCHRONIZED ON AN EXTERNAL SYNCHRONIZATION SIGNAL

BACKGROUND OF THE INVENTION

The present invention relates to a very high stability clock synchronized on an external synchronization signal.

In a digital exchange, it is conventional to use a central time base which delivers signals to various units, thereby enabling the units to operate synchronously. A triplicated time base of this type is described in European patent number 0 129 098, for example. Time bases of this type are controlled by a clock signal provided by a synchronized clock. Such a synchronized clock receives a plurality of rate signals each recovered from a communications path such as a PCM link. By means of a digital phase lock loop, the clock latches onto a selected one of these rate signals. The servo-control loop includes a digital lowpass filter having a large time constant, of the order of several hours, for the purpose of eliminating any jitter that may be present in the selected rate signal.

Jitter is a frequency disturbance having a mean value of zero over a period of time corresponding substantially to the time constant of the filter. After selecting one of the rate signals, the synchronized clock provides a high accuracy signal only after a time delay that corresponds approximately to said time constant.

Thus, when the clock changes the rate signal used as the reference for its servo-control, a jump in frequency usually occurs, and either the clock is allowed to drift over the length of time required to bring it into synchronization with the new rate signal, which length of time is equivalent to the time constant of the filter, or else the time constant of the filter is temporarily shortened, in which case the jitter in the signal is also transmitted to the clock.

The object of the present invention is to provide a synchronized clock which does not have this drawback.

SUMMARY OF THE INVENTION

The present invention provides a synchronized clock receiving a plurality of external synchronization signals, which external signals may be constituted either by a reference signal or by rate signals, the clock comprising:

a clock generator receiving a control signal and producing a clock signal;

a servo-control circuit receiving said clock signal and a corresponding one of said external synchronization signals, and generating a servo-control signal;

the clock further comprising:

means for generating an additional servo-control signal associated at least with one other one of said external synchronization signals; and a control unit producing said control signal on the basis of a selected servo-control signal; and determining which servo-control signal to select as a function of quality criteria for said external synchronization signals.

Firstly, the synchronized clock may include means for comparing one of said servo-control signals with an acceptance range specifying extreme values and maximum time variations and producing an aspect flag relating to said servo-control signal, said aspect flag constituting one of said quality criteria.

Secondly, the synchronized clock may include rate presence test circuits each receiving a corresponding one of the external synchronization signals and delivering a rate-present signal if the received signal is present, the existence of said rate-present signal constituting one of said quality criteria.

Further, the synchronized clock may receive enable signals associated with respective ones of said rate signals and indicative of a fault on the corresponding rate signal, and it may generate an enable flag associated with each of said enable signals providing the duration thereof is less than a duration threshold and the frequency of appearance thereof is less than a frequency threshold, with the presence of said enable flag constituting one of said quality criteria.

Also, in the synchronized clock, said control unit may include a list associating a priority order with each of said external synchronization signals, and said selected servo-control signal may be that one of the servo-control signals which corresponds to the highest priority external synchronization signal in said list that satisfies at least one of said quality criteria.

Advantageously, in the synchronized clock, said control unit has a reference value in its memory, and selects said reference value as said selected servo-control signal in the event that none of said external synchronization signals satisfies at least one of said quality criteria.

In one embodiment, the synchronized clock includes an analysis circuit receiving both said clock signal and a calibration signal, and producing a calibration control signal, and said control unit includes means for calculating said reference value on the basis of said calibration control signal.

Further, the synchronized clock may include at least one analysis circuit receiving both said clock signal and a monitor signal, and producing a verification signal, and said control unit may produces an alarm signal if said verification signal does not lie within an acceptance range specifying extreme values and maximum time variations.

Similarly, the synchronized clock may produce an alarm signal if any one of said rate signals does not satisfy at least one of said quality criteria.

Further, the synchronized clock may produce an alarm signal if said reference signal does not satisfy at least one of said quality criteria.

In addition, the synchronized clock may produce an operating alarm signal if at least one of said monitor signals does not lie within an acceptance range specifying extreme values and maximum time variations, and if none of said external synchronization signals satisfies at least one of said quality criteria.

Finally, the frequencies of said rate signals and/or of said reference signal and/or of said monitor signals and/or of said calibration signal are advantageously multiples of the frequency of said clock signal.

BRIEF DESCRIPTION OF THE DRAWING

The various objects and characteristics of the invention appear in greater detail in the following description of an embodiment given by way of non-limiting example and made with reference to the sole FIGURE of the accompanying drawing which is a block diagram of a synchronized block of the invention.

DETAILED DESCRIPTION OF THE PREFERRED EMBODIMENT

The synchronized clock shown in the FIGURE receives a plurality of external synchronization signals which are either rate signals 1 recovered from communications paths (there may be four of them, for example, even though only one appears in the figure), or else a reference signal 2. The clock also receives monitor signals 3 (and only one is shown) and a calibration signal 4.

Finally, it receives enable signals 5 (only one shown) each associated with a corresponding one of the rate signals 1. It produces a clock signal 6.

The synchronized clock comprises:

a clock generator GH provided with a control input 7 and delivering the clock signal 6;

as many servo-control circuits DA as there are rate signals 1, each servo-control circuit receiving both the clock signal and a corresponding one of the rate signals 1 in order to produce a servo-control signal 8;

a regulation circuit DR receiving both the clock signal and the reference signal 2, and likewise producing a servo-control signal 8;

test circuits PR each receiving a corresponding external synchronization signal, testing it for the presence of a rate, and producing a rate-present signal 10;

analysis circuits CA receiving the clock signal 6 and either a monitor signal 3 or else a calibration signal 4 and respectively producing a verification signal 11 and a calibration control signal 15; and a control unit UC receiving the servo-control signals 8, the enable signals 5, the rate-present signals 10, the verification signals 11, and the calibration control signal 15, to produce a control signal 12 which is applied to the control input 7, and to produce alarm signals 13, 14, 16, and 17.

The clock generator GH comprises a converter circuit 100 which transforms the digital control signal 12 into an analog servo-control signal 20 whose value is proportional to said control signal. It further comprises a frequency generator 101 such as a very high stability voltage controlled crystal oscillator which is controlled by the servo-control signal 20 and which produces a driver signal 21.

The driver signal which may be at 10 MHz, for example, is then applied to a frequency divider 102 which produces the clock signal 6, e.g. at 8 kHz.

Each servo-control circuit DA includes a frequency divider 103 which receives a rate signal 1 and produces an intermediate rate signal 22 at the same frequency as the clock signal 6. Advantageously, the rate signal is at a frequency which is a multiple of the clock signal frequency, e.g. 2.048 MHz. The frequency divider 103 may thus be constituted by a simple counter. A servo-control circuit DA also includes a digital phase lock loop 104 which receives both the clock signal 6 and the intermediate rate signal 22, and which produces a phase signal 23 suitable for servo-controlling the clock generator. The phase signal is injected to a lowpass digital filter 105 having a very large time constant, e.g. several hours. This filter produces a servo-control signal 8 which is free from any jitter that may be present in the rate signal 1.

The regulation circuit DR has the same function as a servo-control circuit DA. It receives a reference signal 2, e.g. a signal produced by an atomic clock, i.e. a signal that is free from jitter. There is therefore no need for the filtering mentioned above. The circuit comprises a frequency divider 106 which reduces the frequency of the reference signal 2 to that of the clock signal, and a digital phase lock loop 107 which directly produces a servo-control signal 8.

Each circuit PR for testing the presence of a rate signal delivers a rate-present signal 10 so long as a signal is indeed applied to its input. Such a circuit may be constituted, for example, by a monostable whose characteristic period is slightly greater than the period of the signal applied to its input.

The verification signal 11 and the calibration control signal 15 delivered by the analysis circuits CA provide information on the phase difference between the clock signal 6 and the corresponding input signal, which information is similar to a servo-control signal. In the first case, the input signal is a monitor signal 3 and may be constituted by an output signal from one of the modules of the triplicated time base (e.g. as mentioned in the introduction) and which is controlled either by the clock signal 6 delivered by the present synchronized clock or else by the clock signal delivered by a second synchronized clock of the same type. In the second case, the input signal is a calibration signal 4 of very high accuracy which is applied temporarily. Each analysis circuit CA comprises a frequency divider 108 to bring the frequency of its input signal down to the frequency of the clock signal 6, followed by a digital phase lock loop 109 which produces a verification signal or a calibration signal, as the case may be.

The control unit UC is advantageously constituted by a microprocessor and associated memory and it comprises means for performing the following operations:
 clock generator control;
 monitor signal analysis;
 calibration signal analysis; and
 alarm signal generation.

The control unit UC delivers the control signal 12 which is selected from the various servo-control signals 8 on the basis of quality criteria. The control unit receives the enable signals 5 associated with respective ones of the rate signals 1, which enable signals are normally zero, but switch to one whenever a fault is present on the associated rate signal. The control unit produces an enable flag providing the enable signal 5 has a duration that is less than a duration threshold and an appearance frequency which is less than a frequency threshold. Both of these thresholds are in the form of digital values stored in the memory. The control unit also generates an aspect flag which is associated with a servo-control signal providing the servo-control signal remains within an acceptance range previously recorded in the memory and specifying extreme values and maximum time variations.

Depending on circumstances, the synchronized clock will have access to a reference signal 2, or it will not have such access. The control unit UC has a list of the various external synchronization signals in an order of priority, and the reference signal 2, if present, has highest priority in the list.

The control unit UC selects the servo-control signal 8 derived from the reference signal 2 as the active control signal 12 providing both the rate-present signal (first quality criterion) and the aspect flag (second quality criterion) associated therewith are present. Otherwise it selects the servo-control signal 8 corresponding to the highest priority one of the rate signals 1 for which the rate present signal (first quality criterion), the aspect flag (second quality criterion), and the enable flag (third quality criterion) are all present.

If none of the external synchronization signals satisfy the above-mentioned quality criteria, then the control unit UC selects a reference value stored in its memory as the control signal 12. This reference value may be the result of the calibration control signal 15 as generated by the calibration signal 4, and as explained below.

The synchronized clock thus includes a plurality of digital phase lock loops, most of which are open loops.

The control unit UC closes one of these loops for the purpose of applying the control signal 12. It includes means for producing the control signal 12 without any frequency discontinuity even when switching between servo-control signals 8, since it stores the servo-control signals in its memory together with the transfer function of the loop.

In the event of an external synchronization signal suffering a fault, the control unit abandons this signal as its servo-control source and it generates a rate signal fault alarm 13 or a reference signal fault alarm 14 (only one alarm 13 is shown in the figure, but naturally there are as many of them as there are rate signals 1). Once the fault has disappeared, the control unit recovers the corresponding signal, possibly after a time delay, so as to take account of the highest priority external synchronization signal.

The control unit UC receives verification signals 11 associated with each of the monitor signals 3. It produces a monitor signal fault alarm 16 (only one is shown) if any of these signals fails to satisfy specifications similar to those described for the external synchronization signals: extreme values, maximum time variations, etc. . . .

The control unit 15 may receive a calibration control signal 15. If the synchronized clock does not have access to a reference signal 2, the frequency generator 101 must be calibrated periodically. The calibration signal 4 (which may come from an atomic clock, for example), generates the calibration control signal 15 via an analysis circuit CA. The control unit records in its memory the digital value that should be applied to the control input 7 of the clock generator GH in the event of all of the external synchronization signals being faulty simultaneously. It is advantageous to record digital data in the memory relating to the aging of the frequency generator (frequency drift). The above-mentioned reference value is determined in this way.

As already mentioned, the present synchronized clock may be duplicated, in particular for reasons of reliability. In such a configuration, one of the monitor signals 3 applied to a first synchronized clock is constituted by the clock signal of a second clock of the same type. The control unit UC of a first clock generates an operating fault alarm 17 if all of the external synchronization signals 1, 2 and the signal 3 from the other clock are found to be faulty simultaneously.

The block diagram of the parts of the synchronized clock as shown in the figure is adapted to facilitating explanation. It will naturally be understood that a practical embodiment may be organized differently. Thus, various different circuits may be combined within a single microprocessor, for example the control unit UC and the digital filters 105. Alternatively, it may be preferred to have a distributed embodiment in which the various items are physically present in the form of different components.

We claim:

1. A synchronized clock receiving a plurality of external synchronization signals, said external synchronization signals including a reference signal and rate signals, said clock comprising:

a clock generator receiving a control signal and producing a clock signal;

a servo-control circuit receiving said clock signal and a corresponding one of said external synchronization signals, and generating a first servo-control signal;

means for generating at least one additional servo-control signal associated with another one of said external synchronization signals; and a control unit for selecting one of said servo-control signals based on quality criteria for said external synchronization signals and for producing said control signal on the basis of said selected servo-control signal.

2. A synchronized clock according to claim 1, including means for comparing one of said servo-control signals with an acceptance range specifying extreme variations and maximum time values and producing an aspect flag relating to said servo-control signal, said aspect flag constituting one of said quality criteria.

3. A synchronized clock according to claim 1, including rate presence test circuits each receiving a corresponding one of the external synchronization signals and delivering a rate-present signal if the received signal is present, the existence of said rate-present signal constituting one of said quality criteria.

4. A synchronized clock according to claim 1, wherein said synchronized clock receives enable signals associated with respective ones of said rate signals and indicative of a fault on the corresponding rate signal, and wherein said control unit generates an enable flag associated with each of said enable signals providing the duration thereof is less than a duration threshold and the frequency of appearance thereof is less than a frequency threshold, with the presence of said enable flag constituting one of said quality criteria.

5. A synchronized clock according to claim 1, wherein said control unit includes a list associating a priority order with each of said external synchronization signals, and wherein said selected servo-control signal is that one of said servo-control signals which corresponds to the highest priority external synchronization signal in said list that satisfies at least one of said quality criteria.

6. A synchronized clock according to claim 1, wherein said control unit has a reference value in its memory, and selects said reference value as said selected servo-control signal in the event that none of said external synchronization signals satisfies at least one of said quality criteria.

7. A synchronized clock according to claim 6, including an analysis circuit receiving both said clock signal and a calibration signal, and producing a calibration control signal, and wherein said control unit includes means for calculating said reference value on the basis of said calibration control signal.

8. A synchronized clock according to claim 1, including at least one analysis circuit receiving both said clock signal and a monitor signal, and producing a verification signal, and wherein said control unit produces an alarm signal if said verification signal does not lie within an acceptance range specifying extreme values and maximum time variations.

9. A synchronized clock according to claim 1, wherein said control unit produces an alarm signal if any one of said rate signals does not satisfy at least one of said quality criteria.

10. A synchronized clock according to claim 6, wherein said control unit produces an alarm signal if said reference signal does not satisfy at least one of said quality criteria.

11. A synchronized clock according to claim 8, wherein said control unit produces an operating alarm signal if said monitor signal does not lie within an acceptance range specifying extreme values and maximum time variations, and if none of said external synchronization signals satisfies at least one of said quality criteria.

12. A synchronized clock according to claim 7, wherein the frequencies of at least one of said rate signals, said reference signal, and said calibration signal are multiples of the frequency of said clock signal.

13. A synchronized clock according to claim 8, wherein the frequencies of said monitor signal and at least one of said rate signals are multiples of the frequency of said clock signal.

14. A synchronized clock according to claim 5, including means for comparing one of said servo-control signals with an acceptance range specifying extreme variations and maximum time values and producing an aspect flag relating to said servo-control signal, said aspect flag constituting one of said quality criteria.

15. A synchronized clock according to claim 14, wherein said synchronized clock receives enable signals associated with respective ones of said rate signals and indicative of a fault on the corresponding rate signal, and wherein said control unit generates an enable flag associated with each of said enable signals providing the duration thereof is less than a duration threshold and the frequency of appearance thereof is less than a frequency threshold, with the presence of said enable flag constituting one of said quality criteria.

16. A synchronized clock according to claim 15, wherein the frequencies of said monitor signal and at least one of said rate signals are multiples of the frequency of said clock signal.

* * * * *